United States Patent
Cho et al.

(10) Patent No.: US 7,952,918 B2
(45) Date of Patent: May 31, 2011

(54) METHOD OF OPERATING A MAGNETORESISTIVE RAM

(75) Inventors: Woo-yeong Cho, Suwon-si (KR); Yun-seung Shin, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/875,297

(22) Filed: Sep. 3, 2010

(65) Prior Publication Data
US 2011/0002160 A1  Jan. 6, 2011

Related U.S. Application Data

(62) Division of application No. 11/902,711, filed on Sep. 25, 2007, now Pat. No. 7,791,929.

(30) Foreign Application Priority Data

Sep. 26, 2006 (KR) .................. 10-2006-0093728

(51) Int. Cl.
*G11C 11/00* (2006.01)
(52) U.S. Cl. ..... 365/158; 365/148; 365/171; 365/225.5; 365/243.5; 977/935
(58) Field of Classification Search .......... 365/48, 365/55, 62, 66, 74, 78, 80–93, 100, 130, 365/131, 148, 158, 171–173, 225.5, 243.5; 216/22; 257/421, E21.665; 438/3; 977/933–935
See application file for complete search history.

(56) References Cited

U.S. PATENT DOCUMENTS

| | | | |
|---|---|---|---|
| 6,208,572 B1 * | 3/2001 | Adams et al. ............... | 365/201 |
| 6,449,200 B1 * | 9/2002 | Nelson et al. .............. | 365/201 |
| 6,479,848 B2 | 11/2002 | Park et al. | |
| 6,498,747 B1 * | 12/2002 | Gogl et al. ................. | 365/158 |
| 6,885,578 B2 * | 4/2005 | Cha .......................... | 365/158 |
| 2004/0113187 A1 * | 6/2004 | Cha .......................... | 257/295 |
| 2005/0174875 A1 | 8/2005 | Katoh | |

FOREIGN PATENT DOCUMENTS

| | | |
|---|---|---|
| JP | 2002-150764 A | 5/2002 |
| JP | 2003-332535 A | 11/2003 |
| KR | 10-2001-0077599 A | 8/2001 |

* cited by examiner

*Primary Examiner* — Richard Elms
*Assistant Examiner* — Harry W Byrne
(74) *Attorney, Agent, or Firm* — Lee & Morse, P.C.

(57) ABSTRACT

A magnetoresistive random access memory (RAM) may include a plurality of variable resistance devices, a plurality of read bitlines electrically connected to respective variable resistance devices, and a plurality of write bitlines alternating with the read bitlines. The magnetoresistive RAM may be configured to apply a first write current through a first write bitline adjacent to a first variable resistance device when writing a first data to the first variable resistance device, and apply a first inhibition current through a second write bitline adjacent to a second variable resistance device, the second variable resistance device being adjacent to the first write bitline, and between the first write bitline and the second write bitline, and the first write current and the first inhibition current flowing in a same direction.

4 Claims, 5 Drawing Sheets

METHOD OF OPERATING A MAGNETORESISTIVE RAM

CROSS REFERENCE TO RELATED APPLICATION

This is a divisional application based on application Ser. No. 11/902,711, filed Sep. 25, 2007 now U.S. Pat. No. 7,791,929, the entire contents of which is hereby incorporated by reference.

BACKGROUND OF THE INVENTION

1. Field of the Invention

Embodiments relate to a magnetoresistive RAM and, more particularly, to a magnetoresistive RAM that includes magnetovariable resistance devices that share a single write bitline, in which an inhibition current is applied concurrently with a write current.

2. Description of the Related Art

Magnetoresistive RAMs may have a faster speed than static random access memory (SRAM) while being more highly integrated, e.g., having a degree of integration about the same as a dynamic random access memory (DRAM), and having nonvolatile characteristics similar to those exhibited by flash memory. In magnetoresistive RAMs, a plurality of variable resistance devices may be connected to a single transistor. Magnetoresistive RAMs may include a stack of a plurality of ferromagnetic thin films. Information may be read from and written to the magnetoresistive RAMs by sensing a variation of current, the current variation depending on the magnetization direction of each of the ferromagnetic thin films. Such magnetoresistive RAMs may be highly integrated, may operate at low power and at high speed, and may be non-volatile.

Magnetoresistive RAMs may be implemented using a giant magnetoresistive (GMR) phenomenon or a spin polarization-based magnetic tunneling junction (MTJ) phenomenon, which use spin to affect the transfer of electrons. Magnetoresistive RAMs using the GMR phenomenon may employ a phenomenon in which resistance when spin directions in two magnetic layers are the same is different from a resistance when the spin directions are different from each other. Magnetoresistive RAMs using the GMR phenomenon may employ two magnetic layers and a conductive, non-magnetic layer therebetween. Magnetoresistive RAMs using the MTJ phenomenon may employ a phenomenon in which tunneling occurs more frequently when spin directions are the same in two magnetic layers than when the spin directions are different from each other. Magnetoresistive RAMs using the MTJ phenomenon may employ two magnetic layers and an insulation layer therebetween.

SUMMARY OF THE INVENTION

Embodiments are therefore directed to a magnetoresistive RAM and associated methods, which substantially overcome one or more of the problems due to the limitations and disadvantages of the related art.

It is therefore a feature of an embodiment to provide a magnetoresistive RAM and associated method, in which an inhibition current is applied concurrently with a data write current.

It is therefore another feature of an embodiment to provide a magnetoresistive RAM and associated method, in which an inhibition current is employed to control a magnitude of a magnetic field applied to variable resistance devices adjacent to a variable resistance device being programmed.

At least one of the above and other features and advantages may be realized by providing a magnetoresistive random access memory (RAM), including a plurality of variable resistance devices, a plurality of read bitlines electrically connected to respective variable resistance devices, and a plurality of write bitlines alternating with the read bitlines. The magnetoresistive RAM may be configured to apply a first write current through a first write bitline adjacent to a first variable resistance device when writing a first data to the first variable resistance device, and apply a first inhibition current through a second write bitline adjacent to a second variable resistance device, the second variable resistance device being adjacent to the first write bitline, and between the first write bitline and the second write bitline, and the first write current and the first inhibition current flowing in a same direction.

Each variable resistance device may be disposed between and may be adjacent to two write bitlines.

The amount of the first inhibition current may be less than that of the first write current.

The amount of the first inhibition current may be about ½ that of the first write current.

The magnetoresistive RAM may be further configured to apply a second write current through a third write bitline adjacent to the first variable resistance device when writing a second data to the first variable resistance device, and apply a second inhibition current through a fourth write bitline adjacent to a third variable resistance device, the first variable resistance device being between the first write bitline and the third write bitline, the third variable resistance device being adjacent to the third write bitline, and between the third write bitline and the fourth write bitline, the first write current and the second write current flowing in the same direction, and the second write current and the second inhibition current flowing concurrently and in the same direction.

The amount of the second inhibition current may be less than that of the second write current.

The amount of the second inhibition current may be about ½ that of the second write current.

Each of the variable resistance devices may include at least one free magnetic layer, the free magnetic layer being substantially parallel to a substrate, the first and second write bitlines may be electrically connected to a corresponding wordline via respective first and second connecting portions, the connecting portions being adjacent to the variable resistance devices and having a major axis oriented in a direction substantially normal to the substrate, and the first write current and the first inhibition current may flow through the respective first and second connection portions so as to generate first and second magnetic fields that interact with the first and second variable resistance devices, respectively.

The first write current flowing through the first connection portion may generate the first magnetic field to interact with both the first and the second variable resistance devices.

At least one of the above and other features and advantages may also be realized by providing a method of operating a magnetoresistive random access memory having a plurality of variable resistance devices electrically connected to respective read bitlines and having write bitlines alternating with the read bitlines, the method including applying a first write current through a first write bitline adjacent to a first variable resistance device so as to write a first data to the first variable resistance device, and applying a first inhibition current through a second write bitline adjacent to a second variable resistance device. The second variable resistance device may be adjacent to the first write bitline, and between the first write bitline and the second write bitline, and the first write current and the first inhibition current may flow concurrently and in a same direction.

Each variable resistance device may be disposed between and may be adjacent to two write bitlines.

The amount of the first inhibition current may be less than that of the first write current.

The amount of the first inhibition current may be about ½ that of the first write current.

The method may further include applying a second write current through a third write bitline adjacent to the first variable resistance device so as to write a second data to the first variable resistance device, and applying a second inhibition current through a fourth write bitline adjacent to a third variable resistance device. The first variable resistance device may be between the first write bitline and the third write bitline, the third variable resistance device may be adjacent to the third write bitline, and may be between the third write bitline and the fourth write bitline, the first write current and the second write current may flow in the same direction, and the second write current and the second inhibition current may flow concurrently and in the same direction.

The amount of the second inhibition current may be less than that of the second write current.

The amount of the second inhibition current may be about ½ that of the second write current.

Each of the variable resistance devices may include at least one free magnetic layer, the free magnetic layer being substantially parallel to a substrate, and the first and second write bitlines may be electrically connected to a corresponding wordline via respective first and second connecting portions, the connecting portions being adjacent to the variable resistance devices and having a major axis oriented in a direction substantially normal to the substrate, the method further including flowing the first write current and the first inhibition current through the respective first and second connection portions so as to generate first and second magnetic fields that interact with the first and second variable resistance devices, respectively.

Flowing the first write current through the first connection portion may generate the first magnetic field to interact with both the first and the second variable resistance devices.

At least one of the above and other features and advantages may also be realized by providing a memory control circuit for a magnetoresistive RAM that includes a plurality of variable resistance devices electrically connected to respective read bitlines and write bitlines alternating with the read bitlines, the memory control circuit including a first circuit element configured to supply a first write current to a first write bitline adjacent to a first variable resistance device when writing a first write data to the first variable resistance device, and a second circuit element configured to supply a first inhibition current to a second write bitline adjacent to a second variable resistance device, the second variable resistance device being adjacent to the first write bitline, and between the first write bitline and the second write bitline, and the first write current and the first inhibition current flowing in a same direction. The memory control circuit may supply the first write current from the first circuit element concurrently with the supply of the first inhibition current from the second circuit element.

At least one of the above and other features and advantages may also be realized by providing an article of manufacture having encoded therein machine-accessible instructions that, when executed by a machine, cause the machine to operate a magnetoresistive random access memory having a plurality of variable resistance devices electrically connected to respective read bitlines and having write bitlines alternating with the read bitlines, the operation including applying a first write current through a first write bitline adjacent to a first variable resistance device so as to write a first data to the first variable resistance device, and applying a first inhibition current through a second write bitline adjacent to a second variable resistance device. The second variable resistance device may be adjacent to the first write bitline, and between the first write bitline and the second write bitline, and the first write current and the first inhibition current may flow concurrently and in a same direction.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION OF THE INVENTION

Figure 1A:
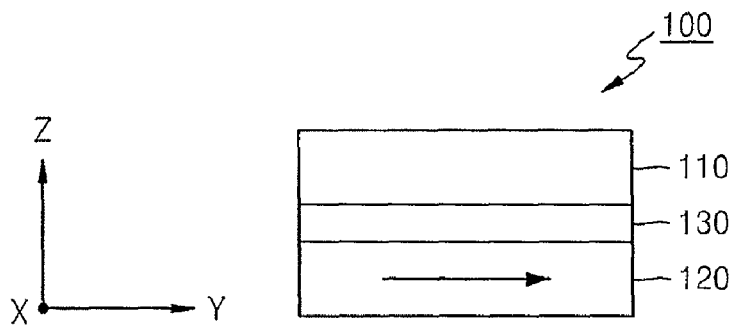
FIGS. 1A, 1B, and 1C illustrate a magnetovariable resistance device included in a magnetoresistive RAM according to an embodiment.

Korean Patent Application No. 10-2006-0093728, filed on Sep. 26, 2006, in the Korean Intellectual Property Office, and entitled: "Magnetoresistive Ram that Allows Inhibition Current to Flow in the Same Direction as Write Current," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1A illustrates a magnetovariable resistance device 100, which may include a fixed layer 120, a free layer 110, and an insulation layer 130. The fixed layer 120 may exhibit a fixed spin orientation. When data is written to the magnetovariable resistance device 100, the spin orientation of the free layer 110 may be altered.

Figure 1B:
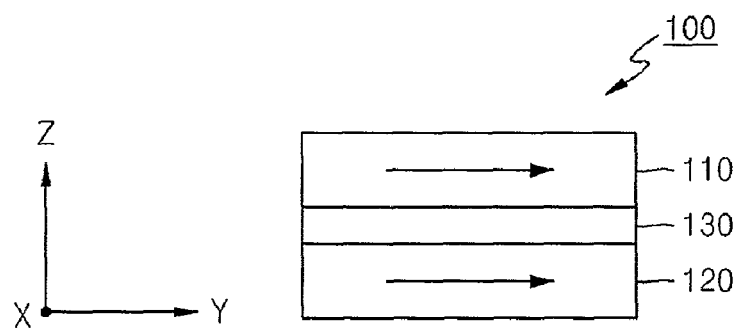
Figure 1C:
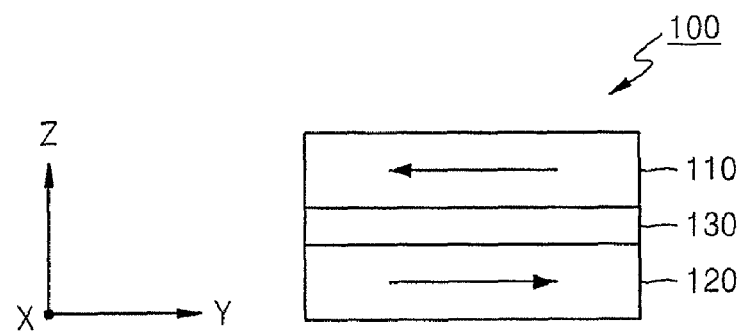

FIGS. 1B and 1C illustrate the magnetovariable resistance device 100 in states in which data has been written and the spin orientation of the free layer 110 has been altered. In FIG. 1B, the spin direction of the free layer 110 is the same as that of the fixed layer 120, whereas in FIG. 1C, the spin direction of the free layer 110 is opposite to that of the fixed layer 120. The spin direction of the free layer 110 with respect to that of the fixed layer 120 may affect the transfer of electrons through the magnetovariable resistive device 100, such that data of different logic levels may written to the respective magnetovariable resistance devices 100 illustrated in FIGS. 1B and 1C.

Figure 2:
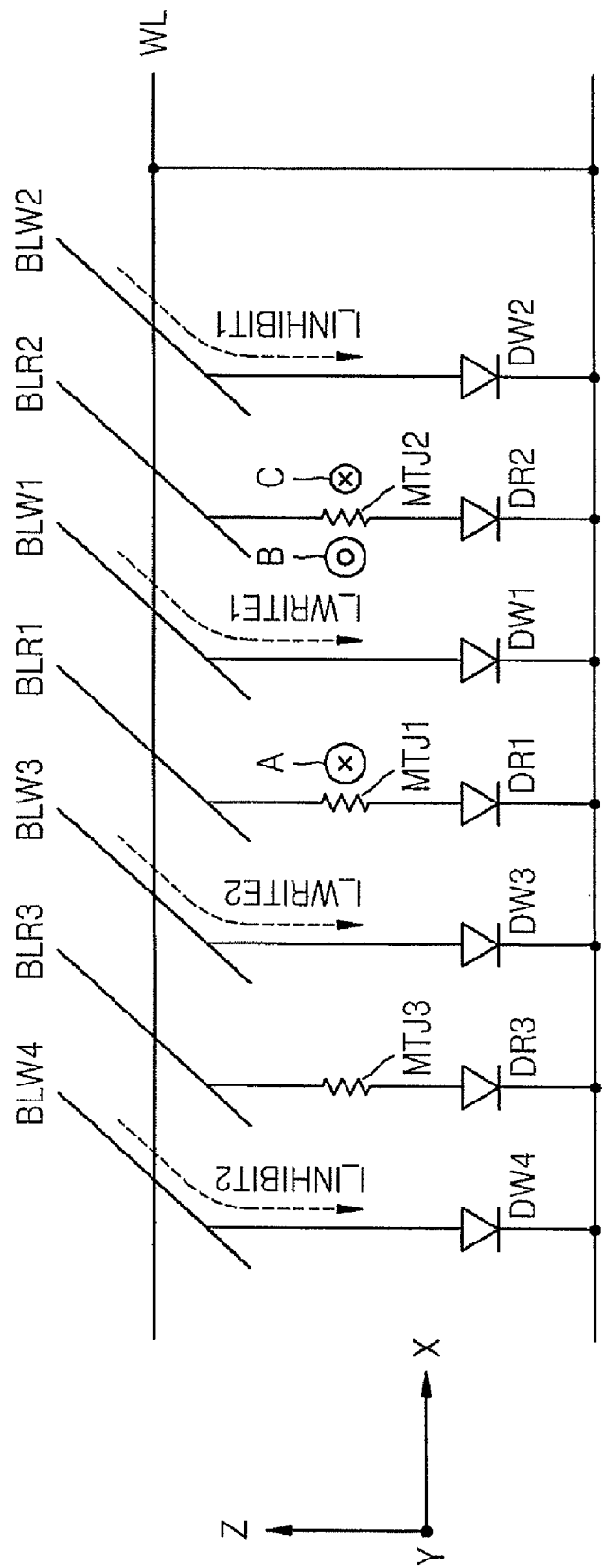
FIG. 2 illustrates an schematic circuit diagram of a magnetoresistive RAM according to an embodiment.

FIG. 2 illustrates a schematic circuit diagram of a magnetoresistive RAM according to an embodiment. Referring to FIG. 2, the magnetoresistive RAM may include a plurality of variable resistance devices MTJ, e.g., MTJ1, MTJ2, MTJ3, etc. The magnetoresistive RAM may further include a plurality of bitlines BL including read bitlines BLR, e.g., BLR1, BLR2, BLR3, etc., and write bitlines BLW, e.g., BLW1, BLW2, BLW3, BLW4, etc. The read bitlines BLR1~BLR3 may be electrically connected to the respective variable resistance devices MTJ1~MTJ3. A plurality of diodes D, e.g., write diodes DW1, DW2, DW3, DW4, etc., and read diodes DR1, DR2, DR3, etc., may be disposed between the corresponding bitlines BLW1~BLW4, BLR1~BLR3 and a wordline WL.

The write bitlines BLW may alternate with the read bitlines BLR. In an implementation, the read bitlines BLR1~BLR3 and the write bitlines BLW1~BLW4 may alternate such that one read bitline BLR is followed by one write bitline BLW, which is in turn followed by another read bitline BLR. Each variable resistance device MTJ may be between two write bitlines BLW.

To write a first data, e.g., a logic "1" or "0," to the first variable resistance device MTJ1, a first write current I_WRITE1 may be provided to flow through the first write bitline BLW1 located on one side of the second variable resistance device MTJ2, and a first inhibition current I_INHIBIT1, flowing in the same direction as the first write current I_WRITE1, may be made to flow through the second write bitline BLW2 disposed on a side of the second variable resistance device MTJ2 that is opposite the first write bitline BLW1. That is, the second read bitline BLR2 and the second variable resistance device MTJ2 may be located between the second write bitline BLW2 and the first write bitline BLW1.

A magnetic field vector A, extending into the plane of FIG. 2 (as indicated by the X symbol at the right side of the first variable resistance device MTJ1 in FIG. 2) may be applied to the first variable resistance device MTJ1 by the first write current I_WRITE1 that flows through the first write bitline BLW1. Accordingly, the first data may be written to the first variable resistance device MTJ1.

The first write current I_WRITE1 may also result in a magnetic field vector B, extending out of the plane of FIG. 2 (as indicated by the O symbol at the left side of the second variable resistance device MTJ2 in FIG. 2), being applied to the second variable resistance device MTJ2, which, if left uncorrected, could inadvertently cause undesired data to be written to the second variable resistance device MTJ2. In order to reduce or eliminate the possibility of data being inadvertently written to the second variable resistance device MTJ2, the first inhibition current I_INHIBIT1 may be made flow through the second write bitline BLW2.

The first inhibition current I_INHIBIT1 may flow in the same direction as the first write current I_WRITE1. That is, the first inhibition current I_INHIBIT1 and the first write current I_WRITE1 may each flow through connecting structures adjacent to the variable resistance devices MTJ such that the current flow in the connecting structures is generally normal to the plane of the layers making up the variable resistance devices MTJ. Accordingly, magnetic fields generated by the flowing current may extend laterally from the connecting structures to the adjacent variable resistance devices MTJ.

The first inhibition current I_INHIBIT1 may be applied at a side of the second variable resistance device MTJ2 that is opposite to the first write current I_WRITE1. Accordingly, the first inhibition current I_INHIBIT1 may apply a magnetic field vector C, oriented in a direction opposite to the direction in which the magnetic field vector B is applied by the first write current I_WRITE1, to the second variable resistance device MTJ2. Thus, the magnetic field vector B applied to the second variable resistance device MTJ2 as a result of the first write current I_WRITE1 may be opposed by the magnetic field vector C applied thereto as a result of the first inhibition current I_INHIBIT1. Thus, the possibility of writing undesired data to the second variable resistance device MTJ2 may be reduced or prevented.

The amount of the first inhibition current I_INHIBIT1 may be less than that of the first write current I_WRITE1. In an implementation, the amount of the first inhibition current I_INHIBIT1 may be, e.g., about ½ the amount of the first write current I_WRITE1. Accordingly, the magnitude of the magnetic field vector C applied to the second variable resistance device MTJ2 may be about ½ that of the oppositely-oriented magnetic field vector B applied thereto. Thus, the net magnetic field applied to the second variable resistance device MTJ2 may be reduced by about ½.

In another implementation (not shown), a spacing between the BLW1 and BLR1 may be different from the spacing between the BLW1 and the BLR2, i.e., the MTJ1 may be separated from the BLW1 by a distance that is different from that separating the MTJ2 from the BLW1. In such a case, the ratio of the first inhibition current I_INHIBIT1 to the first write current I_WRITE1 may be adjusted in proportion to the spacing.

During the writing of the first data, no current may flow through a third write bitline BLW3 disposed on a side of the first variable resistance device MTJ1 opposite to the first write bitline BLW1. That is, the first variable resistance device MTJ1 may be disposed between the third write bitline BLW3 and the first write bitline BLW1, and an amount of a second write current I_WRITE2 illustrated in FIG. 2 may be 0 when the first data is written. Thus, the first data may be written to the first variable resistance device MTJ1 without offsetting the magnetic field vector A applied to the first variable resistance device MTJ1 by the first write current I_WRITE1.

When second data, e.g., data having a logic level opposite to the first data, is written to the first variable resistance device MTJ1, a second write current I_WRITE2 may be provided to flow through a third write bitline BLW3. No current may be provided through the first write bitline BLW1. The second write current I_WRITE2 for writing the second data may flow in the same direction as the direction of the first write current I_WRITE1 for writing the first data.

In this case, in order to prevent undesired data from being written to the third variable resistance device MTJ3, a second inhibition current I_INHIBIT2, flowing in the same direction as the second write current I_WRITE2, may be provided to flow through the fourth write bitline BLW4 that is disposed on a side of the third variable resistance device MTJ3 opposite to the third write bitline BLW3. That is, the third variable resistance device MTJ3 may be located between the fourth write bitline BLW4 and the third write bitline BLW3.

Figure 3:
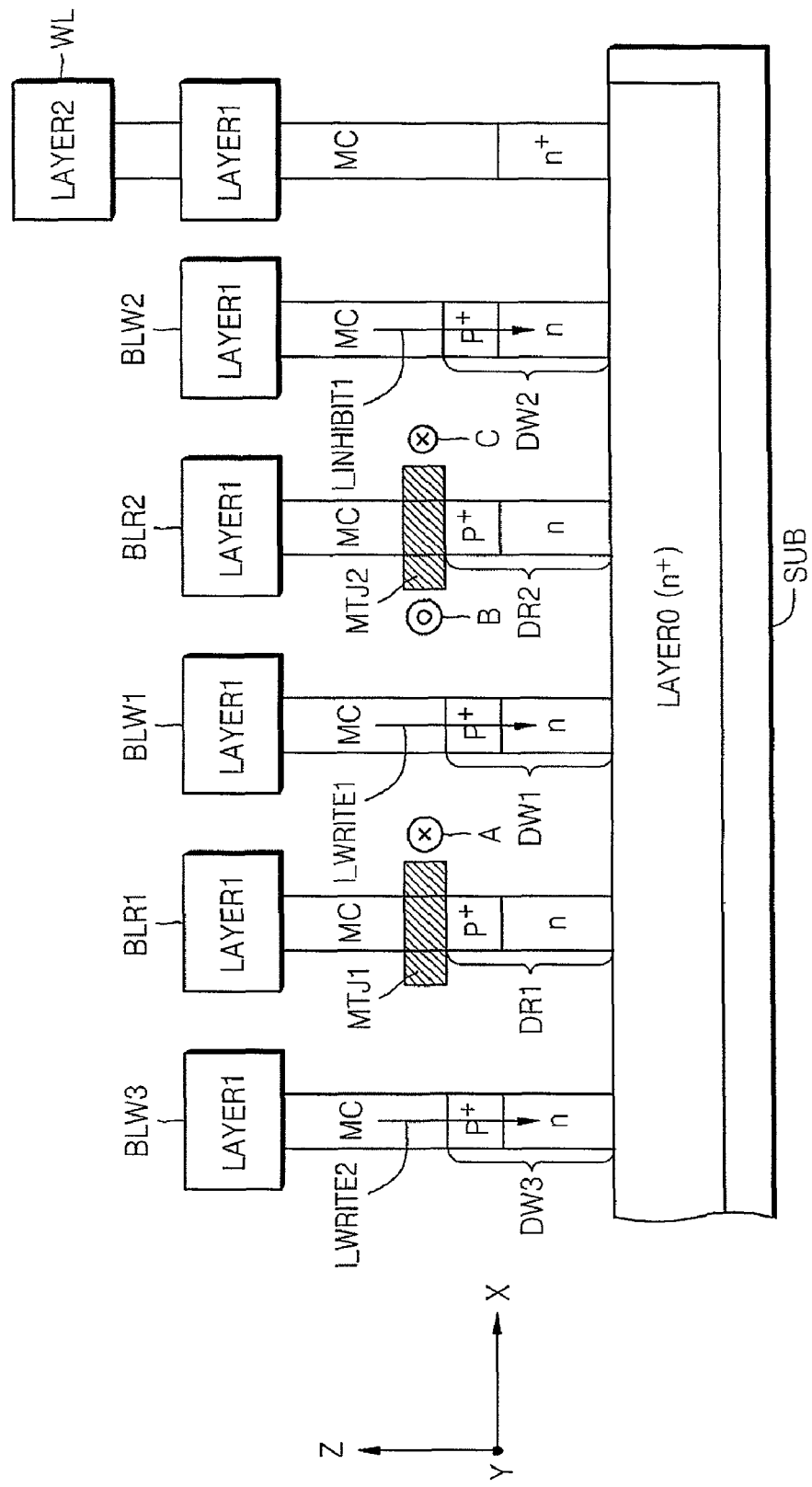
FIG. 3 illustrates a schematic sectional view of a magnetoresistive RAM according to an embodiment.

FIG. 3 illustrates a schematic sectional view of a magnetoresistive RAM according to an embodiment. Referring to FIG. 3, the variable resistance devices MTJ1 and MTJ2 of the magnetoresistive RAM may be each vertically formed on a substrate SUB, e.g., a semiconductor substrate, which may have a first active layer LAYER0, e.g., a n+ layer, which may serve as part of a conductive wordline WL. The first write current I_WRITE1 and the first inhibition current I_INHIBIT1 may flow vertically in connection regions adjacent to the variable resistance devices MTJ, i.e., substantially normal to the substrate and the magnetic thin films of the variable resistance devices MTJ.

The magnetoresistive RAM may include one or more wordlines WL. The wordline WL may be formed over the substrate SUB at a level different from a level where the bitlines BLR1, BLR2, BLW1, BLW2, and BLW3 are arranged. For example, the wordline WL may be arranged on a layer LAYER0 and/or LAYER2 of the semiconductor substrate SUB, and the bitlines BLR1, BLR2, BLW1, BLW2, and BLW3 may be arranged on a layer LAYER1 on the substrate SUB.

The wordline WL and the bitlines BLR1, BLR2, BLW1, BLW2, and BLW3 may be each horizontally arranged on the substrate SUB, and may connect through vertically-oriented connections at the write bitlines BLW and through vertically-stacked variable resistance devices MTJ at the read bitlines BLR.

The write diodes DW1~DW3 and read diodes DR1~DR2 may each include an n region on the substrate SUB and a p⁺ region on the n region. The write diodes DW1~DW3 may each vertically stacked on the substrate SUB and may be connected to the write bitlines BLW1~BLW3, respectively. The read diodes DR1~DR2 may each be vertically stacked on the substrate SUB and may be connected to the variable resistance devices MTJ1~MTJ2, respectively.

The magnetoresistive RAM may further include metal contacts MC. The metal contacts MC may each be vertically arranged on the substrate SUB, and may electrically connect the magnetovariable resistance devices MTJ1~MTJ2 and the diodes DW1~DW3 to the respective bitlines BLR1, BLR2, BLW1, BLW2, and BLW3.

The first active layer LAYER0 may be arranged at a level of the substrate SUB that is different from the level where the bitlines BLR1~BLR2 and BLW1~BLW3 and the diodes DR1~DR2 and DW1~DW3 are arranged. The first active layer LAYER0 may be connected to the overlying portion of wordline WL via corresponding metal contact MC. The diodes DR1~DR2 and DW1~DW3 may be vertically stacked on the first active layer LAYER0.

Figure 4:
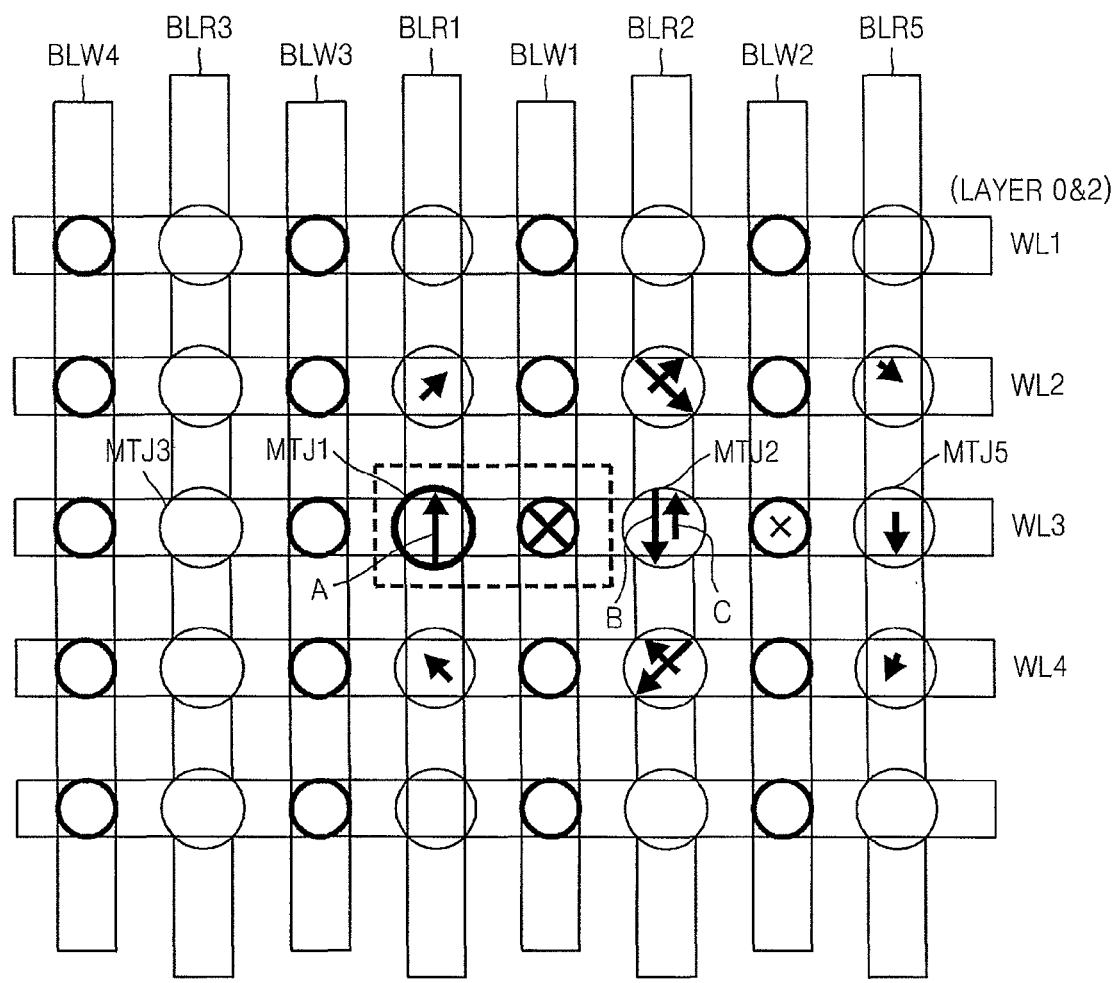
FIG. 4 illustrates a plan view of a magnetoresistive RAM according to an embodiment.
Figure 4:
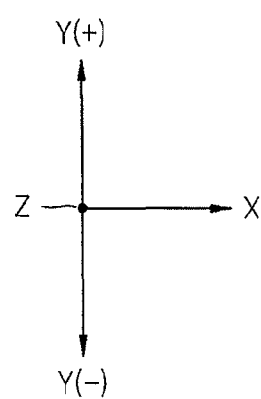

FIG. 4 illustrates a plan view of a magnetoresistive RAM according to an embodiment. In FIG. 4, the z-axis is oriented to extend out of the plane of the page, and the currents I_WRITE and I_INHIBIT are oriented such that current flows into the plane of the page.

In FIG. 4, the magnetic field vector A may be applied to the first variable resistance device MTJ1 by the first write current I_WRITE1 flowing through the first write bitline BLW1. At the same time, the magnetic field vector B, applied to the second variable resistance device MTJ2 by the first write current I_WRITE1 flowing through the first write bitline BLW1, may be offset by the magnetic field vector C that is applied to the second variable resistance device MTJ2 by the first inhibition current I_INHIBIT1 flowing through the second write bitline BLW2.

As shown in FIGS. 3 and 4, the first write current I_WRITE1 applied through the metal contact MC that is disposed at the intersection of the first write bitline BLW1 with the third wordline WL3 flows into the plane of the page and, according to the "right hand rule," magnetic field lines associated with the flow of current into the page circulate clockwise about this metal contact MC. Thus, assuming that the bitlines BLR and BLW are spaced at a uniform pitch, the magnetic field vector A resulting from the first write current I_WRITE1 crosses the first resistance variable device MTJ1 in a generally upward direction, i.e., in the positive (+) y-axis direction, and the oppositely-oriented magnetic field vector B having a generally equal magnitude crosses the second variable resistance device MTJ2 in the negative (−) y-axis direction.

The first inhibition current I_INHIBIT1 applied through the metal contact MC that is disposed at the intersection of the second write bitline BLW2 with the third wordline WL3 also flows into the plane of the page, and magnetic field lines associated with this current flow also circulate clockwise. However, since the first inhibition current I_INHIBIT1 may be applied at an opposite side of the second resistance variable device MTJ2, relative to the first write current I_WRITE1, the magnetic field vector C associated with the first inhibition current I_INHIBIT1 at the second resistance variable device MTJ2 may have an orientation opposite to that of the magnetic field vector B associated with the first write current I_WRITE1. Accordingly, the magnetic field vectors B and C may offset one another at the second variable resistance device MTJ2 in accordance with their relative magnitudes. For example, if the first inhibition current I_INHIBIT1 is about ½ of the first write current I_WRITE1, then the net magnetic field applied to the second variable resistance device MTJ2 as a result of the first write current I_WRITE1 may be reduced by about ½, which may reduce or eliminate the possibility of data being inadvertently written to the second variable resistance device MTJ2.

Further, an adjacent fifth resistance variable device MTJ5 disposed at an intersection of a fifth read bitline BLR5 and the third wordline WL3 may be exposed to the magnetic field produced by the first inhibition current I_INHIBIT1, which, having a magnitude of about ½ the first write current I_WRITE1, may not be large enough to inadvertently write data to the fifth variable resistance device MTJ5.

Figure 5:
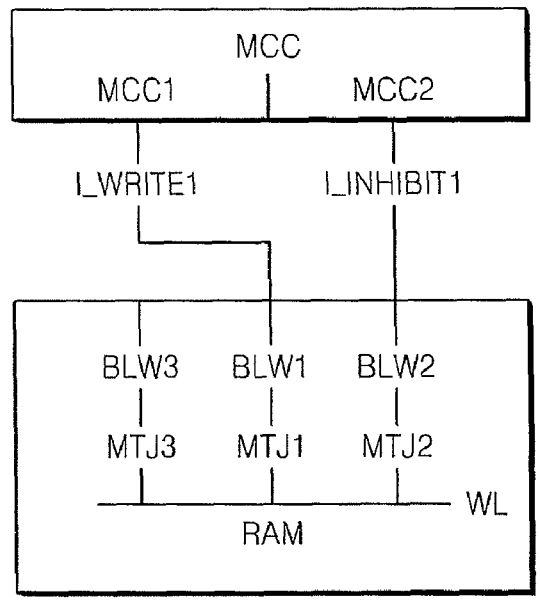
FIG. 5 illustrates a schematic view of a memory control circuit and a magnetoresistive RAM according to an embodiment.

FIG. 5 illustrates a schematic view of a memory control circuit MCC and a magnetoresistive RAM according to an embodiment. In this embodiment, the magnetoresistive RAM may be connected to the memory control circuit MCC that controls the magnetoresistive RAM so as to apply an inhibition current when writing data. The memory control circuit MCC may be connected to the write bitlines BLW, the read bitlines BLR, and the wordlines WL. The memory control circuit MCC may include, e.g., a first circuit element that supplies the first write current I_WRITE1 to the first write bitline BLW1 that is adjacent to the first variable resistance device MTJ1 when writing a first write data to the first variable resistance device. The memory control circuit MCC may further include, e.g., a second circuit element that supplies the first inhibition current I_INHIBIT1 to the second write bitline BLW2 that is adjacent to the second variable resistance device MTJ2. The memory control circuit MCC may supply the first write current I_WRITE1 from the first circuit element concurrently with the supply of the first inhibition current I_INHIBIT1 from the second circuit element.

Figure 6:
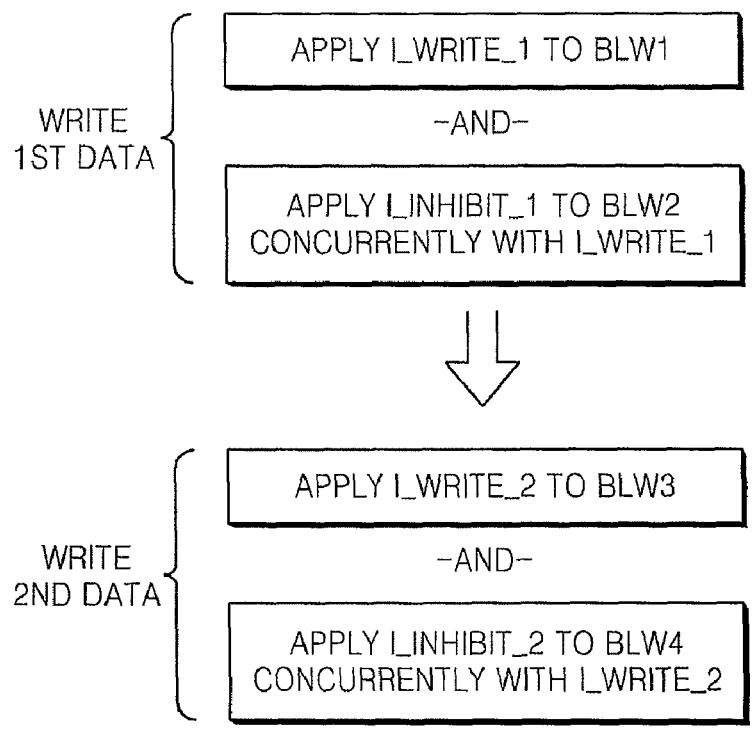
FIG. 6 illustrates a flow chart of operation of a magnetoresistive RAM according to an embodiment.

FIG. 6 illustrates a flow chart of operation of a magnetoresistive RAM according to an embodiment. In this embodiment, operation of the magnetoresistive RAM may be controlled by a machine in accordance with instructions encoded in an article of manufacture. The operations may cause the machine to apply the first write current I_WRITE1 through the first write bitline BLW1 adjacent to the first variable resistance device MTJ1 so as to write a first data to the first variable resistance device MTJ1. The operation may further cause the machine to apply the first inhibition current I_INHIBIT1 through the second write bitline BLW2 adjacent to the second variable resistance device MTJ2. The first write current I_WRITE1 and the first inhibition current I_INHIBIT1 may flow concurrently and in a same direction. In an embodiment, the operations may be embodied as machine-accessible instructions encoded in an article of manufacture, e.g., a CDROM, a mask ROM, firmware in a device that includes a magnetoresistive RAM, etc.

As described above, the size of a magnetoresistive RAM according to the present invention can be reduced by allowing magnetovariable resistance devices to share a single write bitline. In addition, when a write current is made flow through the shared write bitline in order to write data to one of the magnetovariable resistance devices, an inhibition current in the same direction as the write current is made flow through a write bitline adjacent to a magnetovariable resistance device adjacent to the magnetovariable resistance device to which data is to be applied. Therefore, the data may be written to the magnetovariable resistance device without affecting an adjacent magnetovariable resistance device.

Exemplary embodiments of the present invention have been disclosed herein, and although specific terms are employed, they are used and are to be interpreted in a generic and descriptive sense only and not for purpose of limitation.

Accordingly, it will be understood by those of ordinary skill in the art that various changes in form and details may be made without departing from the spirit and scope of the present invention as set forth in the following claims.

What is claimed is:

1. A method of operating a magnetoresistive random access memory having a plurality of variable resistance devices electrically connected to respective read bitlines and having write bitlines alternating with the read bitlines, the method comprising:

applying a first write current through a first write bitline adjacent to a first variable resistance device so as to write a first data to the first variable resistance device; and applying a first inhibition current through a second write bitline adjacent to a second variable resistance device, wherein:

the second variable resistance device is adjacent to the first write bitline, and between the first write bitline and the second write bitline, and the first write current and the first inhibition current flow concurrently and in a same direction.

2. The method as claimed in claim 1, wherein each variable resistance device is disposed between and is adjacent to two write bitlines.

3. The method as claimed in claim 1, wherein the amount of the first inhibition current is less than that of the first write current.

4. The method as claimed in claim 3, wherein the amount of the first inhibition current is about ½ that of the first write current.

* * * * *